(12) United States Patent
Bae et al.

(10) Patent No.: US 7,199,057 B2
(45) Date of Patent: Apr. 3, 2007

(54) METHOD OF ELIMINATING BORON CONTAMINATION IN ANNEALED WAFER

(75) Inventors: So Ik Bae, Daejeon (KR); Yoshinobu Nakada, Ageo (JP); Kenichi Kaneko, Utsunomiya (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 10/525,442

(22) PCT Filed: Aug. 28, 2003

(86) PCT No.: PCT/JP03/10934

§ 371 (c)(1),
(2), (4) Date: Sep. 21, 2005

(87) PCT Pub. No.: WO2004/021428

PCT Pub. Date: Mar. 11, 2004

(65) Prior Publication Data

US 2006/0148249 A1    Jul. 6, 2006

(30) Foreign Application Priority Data

Aug. 30, 2002 (JP) ............................. 2002-252608

(51) Int. Cl.
*H01L 21/311* (2006.01)
*H01L 21/322* (2006.01)

(52) U.S. Cl. .................. 438/694; 438/660; 438/471; 438/475; 438/476; 438/477; 257/E21.275

(58) Field of Classification Search ........... 438/471, 438/475, 476, 477, 694, 660
See application file for complete search history.

(56) References Cited

U.S. PATENT DOCUMENTS

2002/0173173 A1* 11/2002 Kobayashi et al. ......... 438/795

FOREIGN PATENT DOCUMENTS

| EP | 1 347 508 A1 | * 12/2001 |
| EP | 1 251 554 A | 10/2002 |
| JP | 2000-058552 A | 2/2000 |
| JP | 2002-100634 | 4/2002 |
| JP | 2002-190478 A | 7/2002 |
| WO | WO 02/052632 A1 | 7/2002 |
| WO | WO 02/552632 A1 | 7/2002 |

* cited by examiner

*Primary Examiner*—Michael Lebentritt
*Assistant Examiner*—Mohsen Ahmadi
(74) *Attorney, Agent, or Firm*—Pillsbury Winthrop Shaw Pittman, LLP (57) ABSTRACT

A method by which a silicon wafer is prevented from increasing boron concentration near the surface and difference in the boron concentration does not arise between the surface of the annealed wafer and the silicon bulk to eliminate boron contamination in the silicon wafer caused by an annealing treatment is provided. The method includes, when annealing a silicon wafer having a surface on which a native oxide film has formed and boron of environmental origin or from chemical treatment prior to annealing has deposited, steps of carrying out temperature heat-up in a mixed gas atmosphere having a mixing ratio of hydrogen gas to inert gas of 5% to 100% so as to remove the boron-containing native oxide film, followed by annealing in an inert gas atmosphere.

4 Claims, 7 Drawing Sheets

FIG.1A

BEFORE LOADING INTO ANNEALING FURNACE

FIG.1B

HEAT-UP STAGE

FIG.1C

REACHED ANNEALING TEMPERATURE, FOLLOWING COMPLETION OF HEATING UP

METHOD OF ELIMINATING BORON CONTAMINATION IN ANNEALED WAFER

This is the U.S. National Stage of International Application No. PCT/JP03/10934, filed Aug. 28, 2003, which relies for priority on Japanese Patent Application No. 2002-252608, filed Aug. 30, 2002, the contents of both of which are incorporated herein by reference in their entireties.

TECHNICAL FIELD

The present invention relates to a method for eliminating boron contamination in an annealed wafer. The invention relates more particularly to a method for eliminating boron contamination in the surface of a wafer just prior to annealing in order to prevent the diffusion of boron deposits to the interior of the wafer during high-temperature annealing that would cause a decline in the manufacturing yield of devices (semiconductor devices) owing to changes in the electrical characteristics in the wafer surface.

BACKGROUND ART

As the level of device integration rises, crystal defects near the surface of silicon wafers have a larger impact on the manufacturing yield of semiconductor devices. Therefore, a need exists for high-quality silicon wafers that are free of crystal defects. Such wafers have until now generally been obtained by processes that use epitaxial growth. Wafers known as "annealed wafers" have recently been developed, which are obtained by high-temperature treating (annealing) silicon wafers in an inert gas atmosphere to remove near-surface crystal defects.

However, there are a number of drawbacks to annealing treatment. A native oxide film is formed on the wafer surface prior to annealing, and in addition, boron deposits (e.g., $BF_3$, $B_2O_3$, and the like) from the environment to which the wafer is exposed or from the chemical treatment for cleaning the wafer that is carried out prior to annealing are also present. When annealing is carried out in an inert gas atmosphere, the boron deposits diffuse into the wafer interior, increasing the near-surface boron concentration. As a result, the electrical characteristics in the surface near the active region of the semiconductor device change, lowering the manufacturing yield of the devices. Because it is extremely difficult to completely prevent the deposition of boron to the wafer surface during wafer fabrication, there has existed a desire for a method for eliminating boron contamination; that is, a method which prevents the boron concentration near the surface of the wafer from increasing as a result of annealing treatment.

To provide a uniform boron concentration near the wafer surface and also eliminate crystal defects, Japanese published unexamined application JP 2002-100634 discloses a method in which the silicon wafer is heat-treated in a hydrogen gas-containing atmosphere so as to remove deposited boron prior to removal of the native oxide film, then is heat-treated in an inert gas atmosphere. The hydrogen gas concentration in the atmosphere is preferably from 0.1% to the lower explosion limit of about 4%. However, even with the use of this prior-art method, the boron concentration in the surface of the annealed wafer tends to remain higher than the boron concentration in a bulk silicon, and so the outcome has not always been satisfactory.

DISCLOSURE OF THE INVENTION

With the foregoing in view, it is an object of the invention to provide a method which eliminates boron contamination associated with the annealing of wafers, and which can thus make the boron concentration in the wafer surface and the boron concentration in bulk silicon substantially the same.

That is, the method for eliminating boron contamination in an annealed wafer of the present invention includes, when annealing a silicon wafer having a surface on which a native oxide film has formed and boron of environmental origin or from chemical treatment prior to annealing has deposited, steps of carrying out temperature heat-up in a mixed gas atmosphere having a mixing ratio of hydrogen gas to inert gas of 5% to 100% so as to remove the boron-containing native oxide film, followed by annealing in an inert gas atmosphere.

As noted above, Japanese published unexamined application JP 2002-100634 discloses a method which involves carrying out heat treatment in a hydrogen gas-containing atmosphere to remove deposited boron prior to removal of the native oxide film, followed by heat-treating in an inert gas atmosphere, however, the hydrogen gas concentration in the hydrogen gas-containing atmosphere is indicated therein as being preferably from 0.1% to the lower explosion limit of about 4%. This range is intended to eliminate the need for a heat-treating furnace having a sealed construction that provides greater airtightness and for explosion-protected equipment, and moreover assumes the use of a normal-pressure furnace. Hence, the possibility of using gas having a hydrogen gas concentration of 5% or more has not been investigated whatsoever. Moreover, the temperature range of heat treatment is from 900 to 1,100° C., which was presumably arrived at to strike a balance between the etching rate of the native oxide film and the vaporization and diffusion of the deposited boron.

We have conducted investigations on mixed gases including an inert gas and hydrogen gas without limiting the hydrogen gas concentration, and as a result, we have found that by subjecting wafers to temperature heat-up in a mixed gas atmosphere having a hydrogen gas mixing ratio of 5% or more, followed by annealing treatment in an inert gas atmosphere, a boron concentration in the wafer surface and a boron concentration in the silicon bulk which are substantially the same can be achieved. At a hydrogen gas mixing ratio of less than 5%, the boron concentration in the wafer surface becomes much higher than the boron concentration in the silicon bulk, resulting in a large change in the electrical resistivity. The hydrogen gas mixing ratio is preferably from 10 to 30%.

Figure 1A:
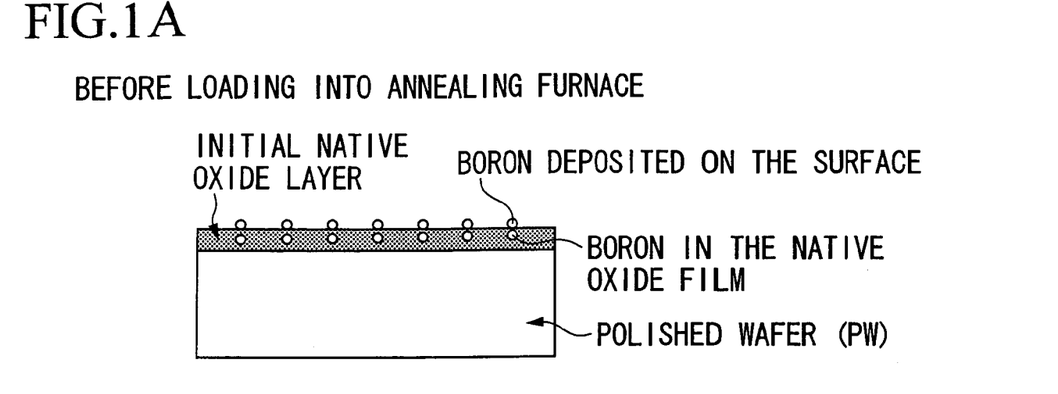
FIGS. 1A, 1B, and 1C are schematic views of steps in the method for eliminating boron contamination in an annealed wafer of the present invention.
Figure 1B:
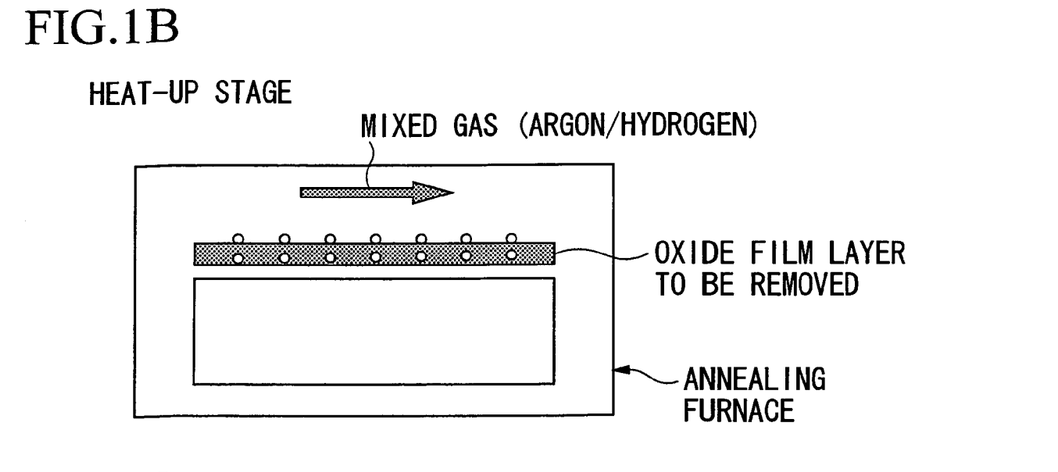
Figure 1C:
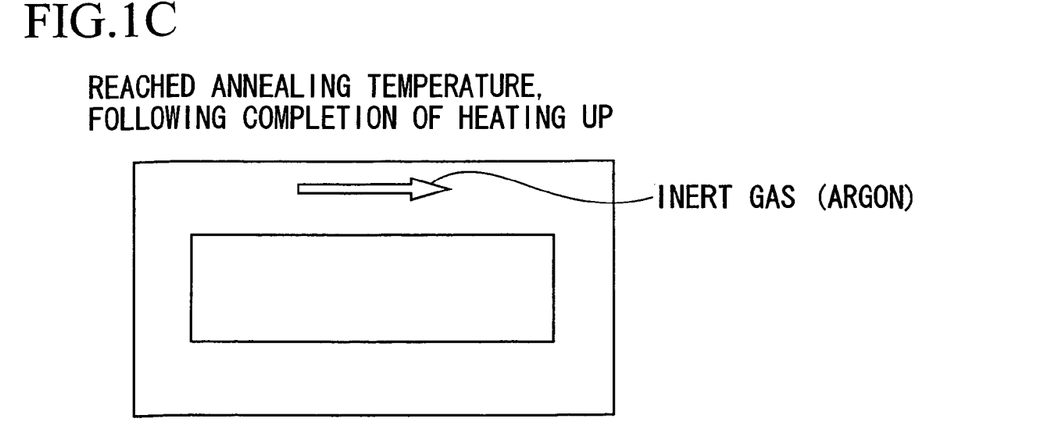

FIGS. 1A to 1C are schematic views illustrating the steps of removing a boron-containing native oxide film, followed by carrying out annealing treatment in an inert gas atmosphere according to the method for eliminating boron contamination in an annealed wafer of the present invention. FIG. 1A is a schematic view of a cross-section of a polished wafer that has been polished before being loaded into an annealing furnace. A native oxide film has formed on the surface, and boron is present both on the surface of the oxide film and in the oxide film. FIG. 1B is the stage of heating up after the wafer has been loaded into the annealing furnace. Since the entire oxide film is removed in a mixed gas atmosphere of argon and hydrogen, the boron in the surface and in the oxide film are removed. FIG. 1C is the stage in which the temperature has reached the annealing temperature following the completion of temperature heat-up. No oxide film or deposited boron is present on the surface of the wafer when it is treated in an inert gas atmosphere.

In the present invention, a treatment temperature of the temperature heat-up in the mixed gas atmosphere can be set from 700 to 1,200° C.

BEST MODE FOR CARRYING OUT THE INVENTION

Figure 2:
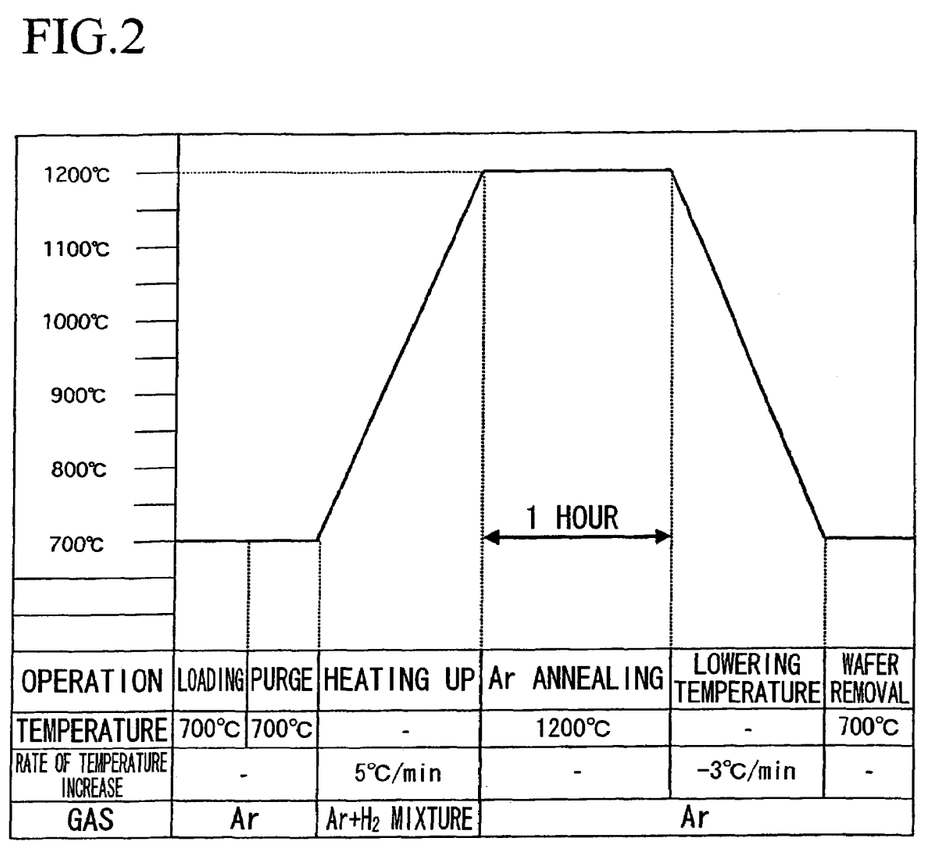
FIG. 2 is an example of a process chart for carrying out the method for eliminating boron contamination in an annealed wafer of the present invention.
Figure 3:
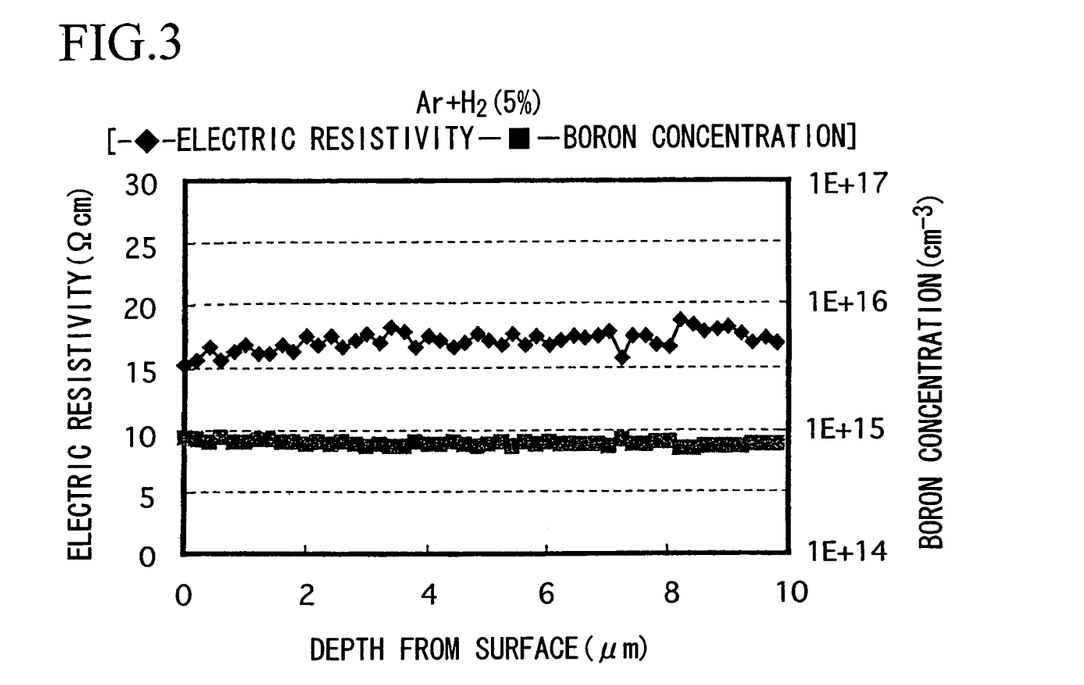
FIG. 3 shows the boron concentration and resistivity profiles in the depth direction of the wafer, as measured by the spreading resistance (SR) method in Example 1.
Figure 4:
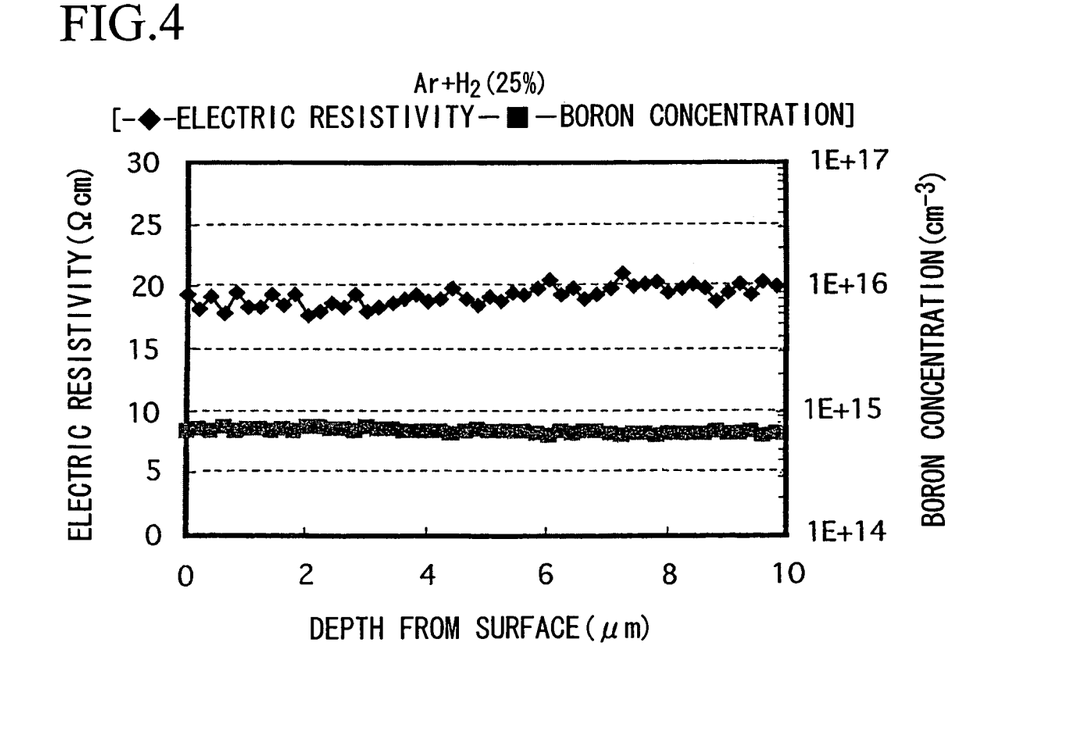
FIG. 4 shows the boron concentration and resistivity profiles in the depth direction of the wafer, as measured by the SR method in Example 2.
Figure 5:
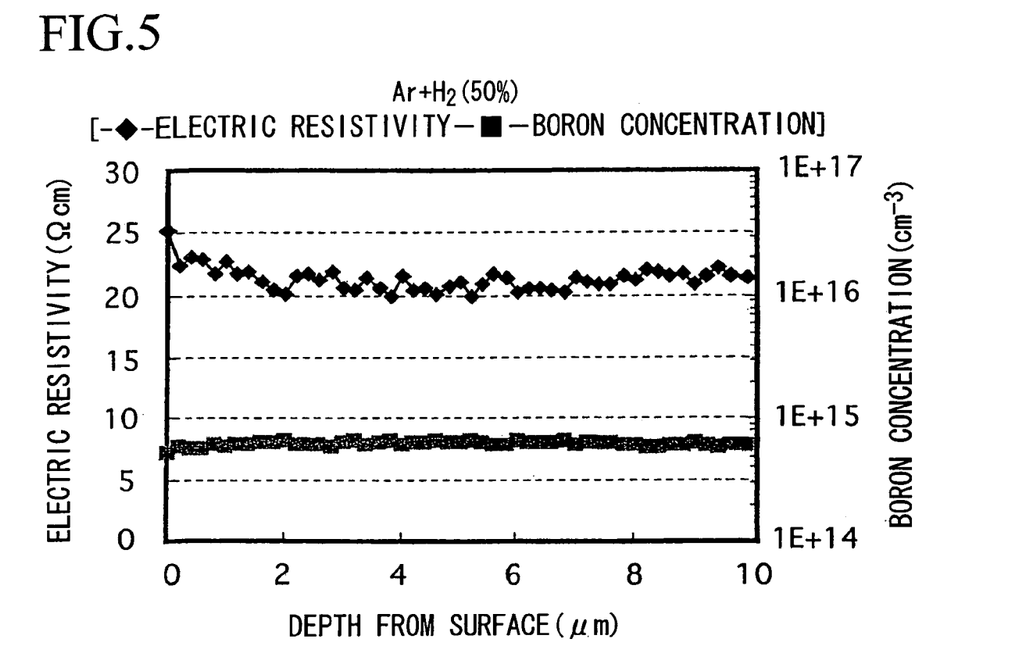
FIG. 5 shows the boron concentration and resistivity profiles in the depth direction of the wafer, as measured by the SR method in Example 3.
Figure 6:
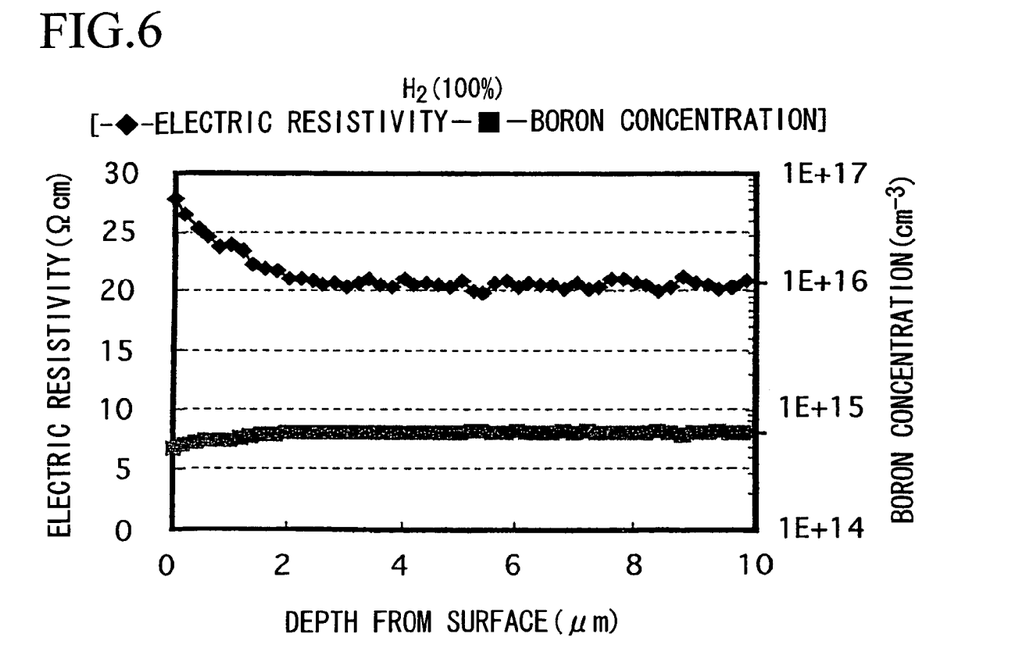
FIG. 6 shows the boron concentration and resistivity profiles in the depth direction of the wafer, as measured by the SR method in Example 4.
Figure 7:
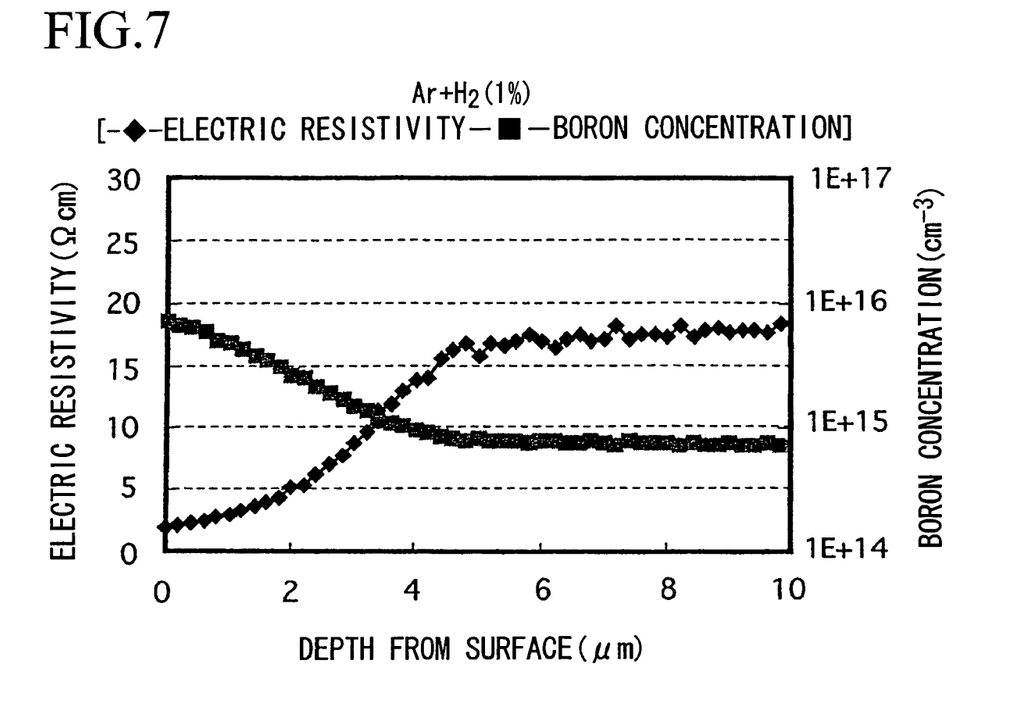
FIG. 7 shows the boron concentration and resistivity profiles in the depth direction of the wafer, as measured by the SR method in Comparative Example 1.

Embodiments of the present invention are described below. FIG. 2 is an example of a process chart showing parameters such as temperatures and gas compositions with time in a temperature heat-up process, an annealing treatment process, and associated processes therewith.

The processes shown in FIG. 2 are explained. Here, argon gas is used as an inert gas. First, a wafer is loaded into an annealing furnace at 700° C. and is purged using argon gas only. Next, the temperature is heated up to 1,200° C. at a rate of 5° C./min in a mixed gas atmosphere of argon and hydrogen having a given ratio. The atmosphere is then changed to argon gas only, and annealing is carried out at 1,200° C. for 1 hour. After the temperature is subsequently lowered to 700° C. at −3° C./min, the wafer is removed from the annealing furnace.

The present invention will now be described specifically with examples, however, it is to be understood that the present invention is not limited to these examples.

EXAMPLE 1

A polished wafer (PW) of P-type silicon having a (100) plane orientation which was obtained by slicing from an ingot grown by the Czochralski technique and polishing, and which had an electrical resistivity of 20 Ω·cm, an oxygen concentration of 1E18 atom/cm³, and a diameter of 200 mm, was used. The polished wafer was washed twice with SC-1 (a mixture of ammonia, hydrogen peroxide, and water), and then washed with hydrochloric acid, followed by been loaded into an annealing furnace. This wafer was held in a clean room for about one week, and with a native oxide film formed on the wafer surface and boron deposits also present on the surface, the wafer was then furnished for testing.

Annealing was carried out as shown in FIG. 2, and in a temperature heat-up process, a mixed gas having a mixing ratio of hydrogen gas to argon gas of 5% was used.

The resulting annealed wafer was measured by a spreading resistance (SR) method to determine changes in boron concentration and electrical resistivity in a depth direction near the surface of the wafer. The change in boron concentration in the depth direction near the surface of the wafer was also measured by a secondary ion mass spectroscopy (SIMS).

EXAMPLE 2

Except for using a mixed gas having a mixing ratio of hydrogen gas to argon gas of 25% during heating up, annealing was carried out in the same way as in Example 1, and the resulting annealed wafer was similarly measured.

EXAMPLE 3

Except for using a mixed gas having a mixing ratio of hydrogen gas to argon gas of 50% during heating up, annealing was carried out in the same way as in Example 1, and the resulting annealed wafer was similarly measured.

EXAMPLE 4

Except for using 100% hydrogen gas during heating up, annealing was carried out in the same way as in Example 1, and the resulting annealed wafer was similarly measured.

COMPARATIVE EXAMPLE 1

Except for using a mixed gas having a mixing ratio of hydrogen gas to argon gas of 1% during heating up, annealing was carried out in the same way as in Example 1, and the resulting annealed wafer was similarly measured.

Figure 8:
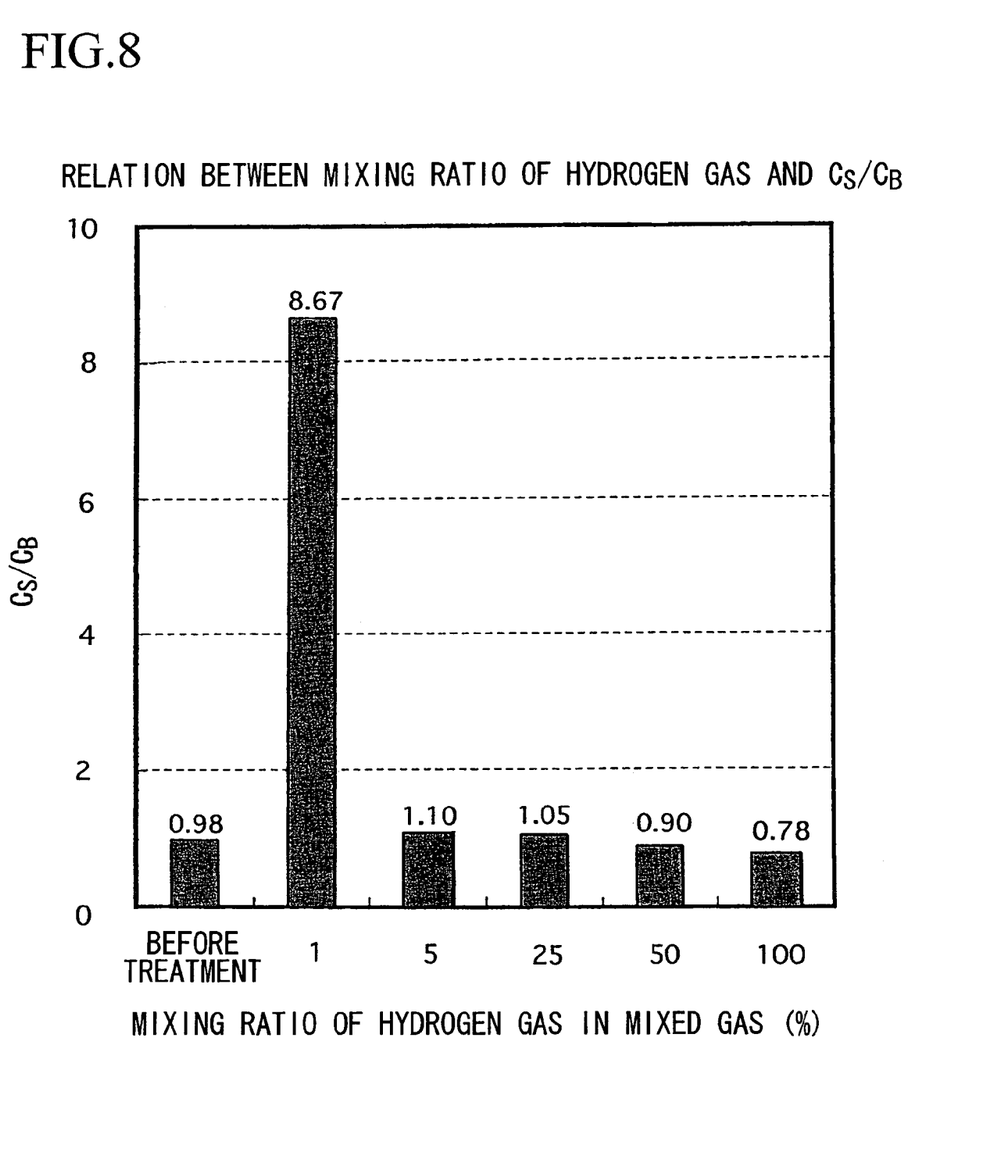
FIG. 8 is a graph of the ratio of the wafer surface boron concentration ($C_S$) to the boron concentration in bulk ($C_B$) versus the hydrogen gas mixing ratio.
Figure 9:
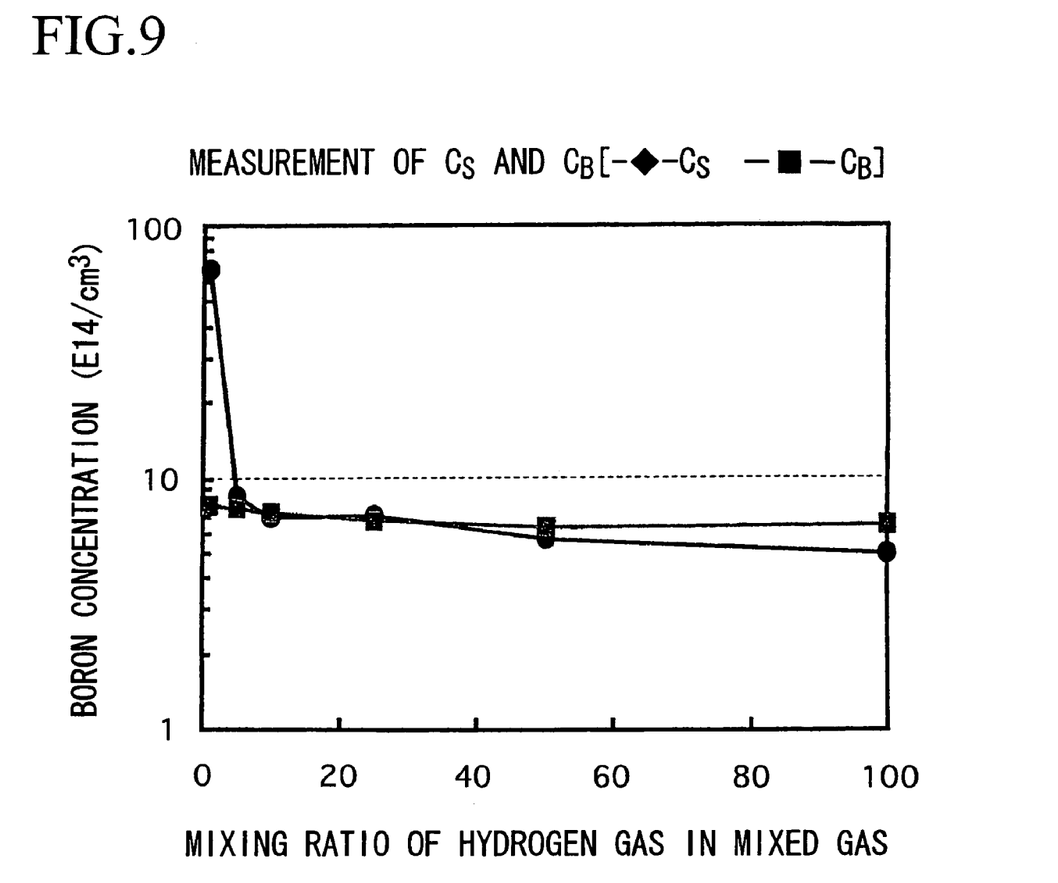
FIG. 9 is a graph in which the wafer surface boron concentration ($C_S$) and the boron concentration in bulk ($C_B$) are each plotted separately against the hydrogen gas mixing ratio.

FIGS. 3 to 7 show boron concentration profiles and electrical resistivity profiles in the wafer depth direction, as determined by the SR method, for Examples 1 to 4 and Comparative Example 1. FIG. 8 shows a graph of a ratio ($C_S/C_B$) of a surface boron concentration ($C_S$) to a boron concentration in a bulk silicon ($C_B$) versus the hydrogen gas concentration. FIG. 9 is a graph in which $C_S$ and $C_B$ are each plotted separately against the hydrogen gas mixing ratio.

It is apparent from these results that at a hydrogen gas mixing ratio of 5% or more in the mixing gas during heating up, there is little difference between $C_S$ and $C_B$. The same can be said concerning the resistivity as well. Moreover, there is substantially no difference in FIG. 9 between $C_S$ and $C_B$ when the hydrogen gas mixing ratio in the mixed gas is from 10 to 30%, indicating this to be an even more preferable range in the hydrogen gas mixing ratio. On the other hand, at a hydrogen gas mixing ratio of less than 5%, $C_S$ is much larger than $C_B$, greatly changing the electrical resistivity. It can be concluded from these results that to achieve the object of the invention the hydrogen gas mixing ratio in the mixed gas during heating up must be 5% or more, and is preferably 10 to 30%.

The boron concentration profiles in the wafer depth direction determined by SIMS in Examples 1 to 4 and Comparative Example 1 showed the same trend as the foregoing boron concentration profile results obtained by the SR method. The samples obtained at a hydrogen gas mixing ratio of 25% in the mixed gas had the flattest boron concentration profile, and were thus found to be desirable. At a hydrogen gas mixing ratio of 50% or more, the surface boron concentration tended to decrease, which agreed with the above results indicating the preferred hydrogen gas mixing ratio in the mixed gas to be from 10 to 30%.

INDUSTRIAL APPLICABILITY

As explained above, according to the present invention, when annealing a silicon wafer having a surface on which a native oxide film has formed and on which boron of environmental origin or from chemical treatment prior to annealing has deposited, by heating up the wafer in a mixed gas atmosphere having a mixing ratio of hydrogen gas to an inert gas of 5% to 100% so as to remove the boron-containing native oxide film, followed by annealing the wafer in an inert gas atmosphere, difference in boron concentration does not arise between the surface of the annealed wafer and the silicon bulk. As a result, the electrical characteristics in the wafer surface do not change, making it possible to reliably and effectively prevent a decline in the manufacturing yield of semiconductor devices.

The invention claimed is:

1. A method for eliminating boron contamination in an annealed wafer, the method comprising, annealing a silicon wafer having a surface on which a native oxide film has formed containing boron of environmental origin or from chemical treatment prior to the annealing, wherein in the annealing, the silicon wafer is subjected to temperature heat-up in a mixed gas atmosphere having a ratio of hydrogen gas to an inert gas of 5% to 100% so as to remove the boron-containing native oxide film, and subsequent annealing in an inert gas atmosphere, and a boron concentration in the wafer surface and a boron concentration in the bulk silicon are made to be substantially same by the annealing, wherein a ratio of the boron concentration in the wafer surface to the boron concentration in the bulk silicon is controlled to be 0.78 to 1.10.

2. The method for eliminating boron contamination in an annealed wafer according to claim 1, wherein a treatment temperature of the temperature heat-up in the mixed gas atmosphere is from 700° C. to 1,200° C.

3. The method for eliminating baron contamination in an annealed water according to claim 1, wherein the temperature heat-up is carried out in the mixed gas atmosphere in which the ratio of the hydrogen gas to the inert gas is from 10% to 30%.

4. The method for eliminating boron contamination in an annealed wafer according to claim 2, wherein the temperature heat-up is carried out in the mixed gas atmosphere in which the ratio of the hydrogen gas to the inert gas is from 10% to 30%.

* * * * *